(12) United States Patent
Isomura et al.

(10) Patent No.: US 8,957,469 B2
(45) Date of Patent: Feb. 17, 2015

(54) SEMICONDUCTOR STORAGE DEVICE AND MANUFACTURING METHOD OF SEMICONDUCTOR STORAGE DEVICE

(75) Inventors: Ryosuke Isomura, Yokohama (JP); Wataru Sakamoto, Yokkaichi (JP); Hiroyuki Nitta, Yokkaichi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 138 days.

(21) Appl. No.: 13/401,126

(22) Filed: Feb. 21, 2012

(65) Prior Publication Data
US 2012/0213006 A1    Aug. 23, 2012

(30) Foreign Application Priority Data
Feb. 21, 2011 (JP) ................. 2011-034963

(51) Int. Cl.
| | |
|---|---|
| H01L 21/764 | (2006.01) |
| H01L 27/105 | (2006.01) |
| H01L 27/115 | (2006.01) |
| G11C 16/04 | (2006.01) |

(52) U.S. Cl.
CPC ........ H01L 27/11524 (2013.01); H01L 21/764 (2013.01); G11C 16/0483 (2013.01)
USPC .................. 257/315; 257/314; 257/E21.209; 438/257; 438/258; 438/254

(58) Field of Classification Search
CPC ............ H01L 27/11524; H01L 21/764; H01L 21/28123; H01L 21/76224; H01L 27/11546; H01L 27/105; H01L 27/11526; H01L 21/823481
USPC .................. 257/315, 314, E21.209, E21.659, 257/E21.691, E21.18; 438/257, 258, 266, 438/254, 262, 591
See application file for complete search history.

(56) References Cited

U.S. PATENT DOCUMENTS

| | | | |
|---|---|---|---|
| 6,395,598 B1 * | 5/2002 | Hirai et al. ................. | 438/242 |
| 2003/0151069 A1 * | 8/2003 | Sugimae et al. ............ | 257/200 |
| 2004/0058499 A1 * | 3/2004 | Ishitsuka et al. ............ | 438/296 |
| 2009/0206391 A1 | 8/2009 | Ando et al. | |

(Continued)

FOREIGN PATENT DOCUMENTS

| | | |
|---|---|---|
| JP | 2009-27131 A | 2/2009 |
| JP | 2009-231300 | 10/2009 |
| JP | 2009-277897 | 11/2009 |

(Continued)

OTHER PUBLICATIONS

Japanese Office Action issued Apr. 27, 2012, in Japan Patent Application No. 2011-034963 (with English translation).
Office Action issued on Nov. 15, 2013 in the corresponding Japanese Patent Application No. 2012-166250 (with English Translation).
Office Action mailed May 30, 2014, in Japanese Patent Application No. 2012-166250 (with English-language translation).

*Primary Examiner* — David Vu
*Assistant Examiner* — Mouloucoulaye Inoussa
(74) *Attorney, Agent, or Firm* — Oblon, Spivak, McClelland, Maier & Neustadt, L.L.P.

(57) ABSTRACT

A semiconductor storage device according to an embodiment comprises a memory cell string in which a plurality of memory cells each having a gate are serially connected to each other. A selective transistor is connected to an end memory cell at an end of the memory cell string. A sidewall film covers a side surface of a gate of the end memory cell and a side surface of a gate of the selective transistor between the end memory cell and the selective transistor. An air gap is provided between the sidewall film of the end memory cell and the sidewall film of the selective transistor.

13 Claims, 14 Drawing Sheets

(56) References Cited

U.S. PATENT DOCUMENTS

2010/0237398 A1 9/2010 Kamigaichi et al.
2011/0097887 A1 4/2011 Aoyama et al.

FOREIGN PATENT DOCUMENTS

JP 2010-80853 4/2010
JP 2010-87160 4/2010

* cited by examiner

SEMICONDUCTOR STORAGE DEVICE AND MANUFACTURING METHOD OF SEMICONDUCTOR STORAGE DEVICE

CROSS REFERENCE TO RELATED APPLICATIONS

This application is based upon and claims the benefit of priority from the prior Japanese Patent Application No. 2011-34963, filed on Feb. 21, 2011, the entire contents of which are incorporated herein by reference.

FIELD

The embodiments of the present invention relate to a semiconductor storage device and a manufacturing method of a semiconductor storage device.

BACKGROUND

Recently, there has been a high demand for downscaling semiconductor storage devices such as a NAND flash memory (NAND EEPROM). However, when such a memory is downscaled, a space between memory cells is reduced and thus interference between the memory cells (adjacent interference effect) becomes an unignorable level. The adjacent interference effect is a phenomenon that a threshold voltage of a memory cell in which data has been written is shifted by a data writing operation on an adjacent memory cell. The adjacent interference effect enlarges distribution of the threshold voltage of the memory cell and thus the reliability of read data is degraded.

The adjacent interference effect is caused by a large coupling capacitance between adjacent memory cells. Accordingly, in order to reduce the coupling capacitance between adjacent memory cells, it is conceivable to have an air gap with a reduced dielectric constant formed between memory cells. Furthermore, in order to reduce an adjacent interference effect between a memory cell and a selective transistor, it is conceivable to have an air gap also formed between the memory cell and the selective transistor.

However, when an air gap is formed between adjacent memory cells and between a memory cell and a selective transistor, the air gap is formed also between the selective transistor and a contact and between a transistor of a peripheral circuit and the contact. In this case, a contact hole formed in the vicinity of the selective transistor and the transistor of the peripheral circuit communicates with the air gap, in such a manner that a material for a contact enters into the air gap. This phenomenon leads to a short-circuit between contacts adjacent to each other in a bit line direction. This also reduces a breakdown voltage between the selective transistor and the contact and causes deterioration in the reliability of the memory.

To handle these problems, the contact hole needs to be formed to be further away than the air gap in such a manner that the contact hole does not communicate with the air gap. In this case, the space between the transistor and the contact and the space between transistors in the peripheral circuit need to be designed to be wide. This arrangement prevents downscaling of memories.

BRIEF DESCRIPTION OF THE DRAWINGS

FIGS. 6 to 14 to which "B" is attached are cross-sectional views of a manufacturing method of the transistor Tr in a peripheral circuit region.

DETAILED DESCRIPTION

A semiconductor storage device according to an embodiment comprises a memory cell string in which a plurality of memory cells each having a gate are serially connected to each other. A selective transistor is connected to an end memory cell at an end of the memory cell string. A sidewall film covers a side surface of a gate of the end memory cell and a side surface of a gate of the selective transistor between the end memory cell and the selective transistor. An air gap is provided between the sidewall film of the end memory cell and the sidewall film of the selective transistor.

Embodiments will now be explained with reference to the accompanying drawings. The present invention is not limited to the embodiments.

Figure 1:
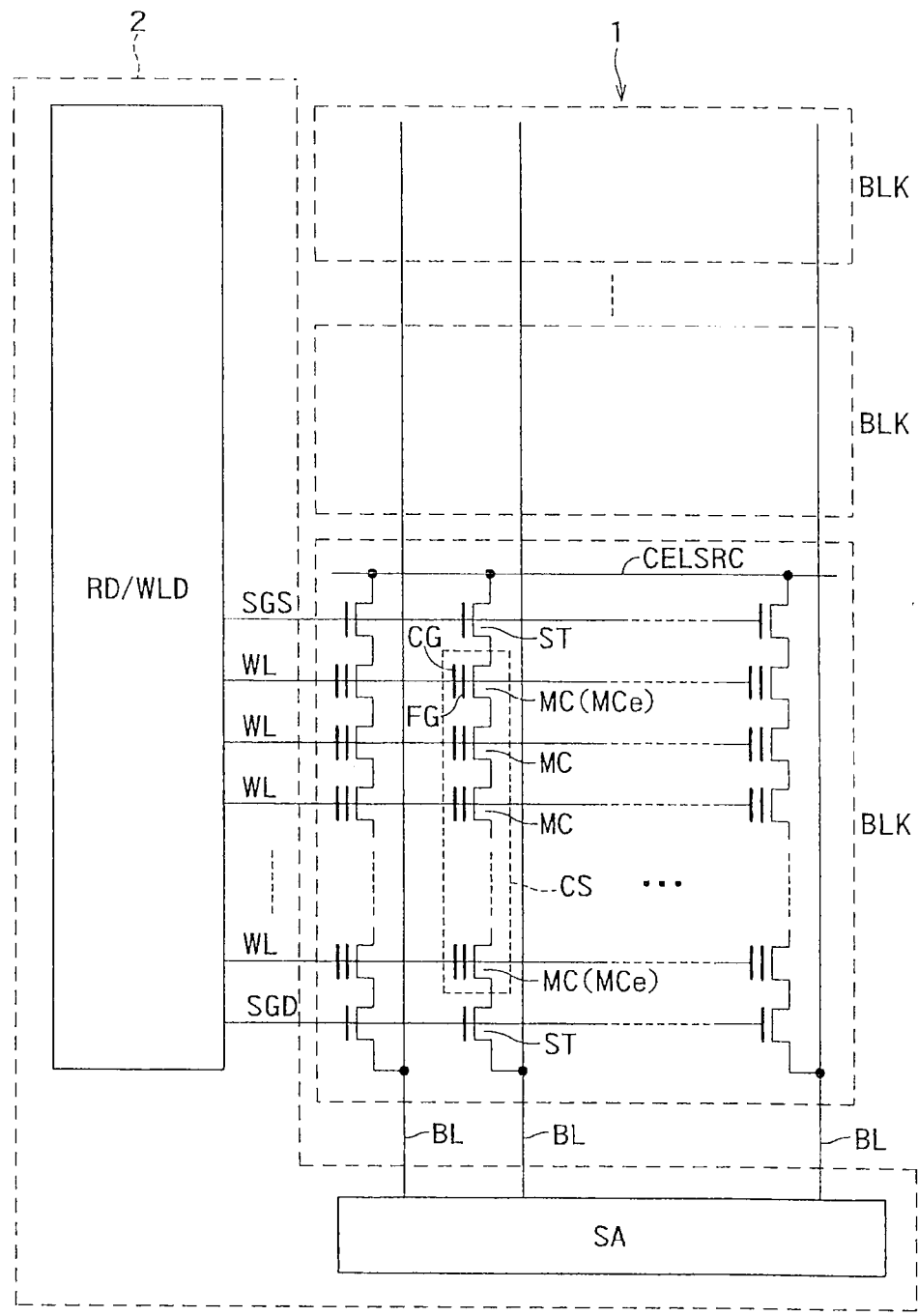
FIG. 1 shows a configuration of a semiconductor storage device according to an embodiment.

FIG. 1 shows a configuration of a semiconductor storage device according to an embodiment. For example, the semiconductor storage device is a NAND flash memory (hereinafter, simply "memory"). The memory includes a memory cell array 1 in which a plurality of memory cells MC are two-dimensionally arranged in a matrix and a peripheral circuit region 2 that controls the memory cell array 1.

The memory cell array 1 includes a plurality of blocks BLK, and each of the blocks BLK includes a plurality of memory cell strings (hereinafter, simply "strings") CS. The block BLK is a unit of data deletion. The string CS includes plural memory cells MC serially connected to each other. Memory cells (end memory cells) MCe at both ends of the string CS are connected to selective transistors ST. One end memory cell MCe is connected via a selective transistor ST to a bit line BL, and the other end memory cell MCe is connected via another selective transistor ST to a cell source CELSRC.

Word lines WL are connected to control gates CG of memory cells MC arranged in a row direction. Selective gate lines SGS and SGD are connected to gates of the selective transistors ST. The word lines WL and the selective gate lines SGS and SGD are driven by a row decoder and a word line driver WLD.

Each bit line BL is connected to the string CS via the selective transistor ST. Each bit line BL is also connected to a sense amplifier circuit SA. Plural memory cells MC connected to a word line constitute a page serving as a unit of reading and writing data at a time.

By driving the selective transistors ST by the selective gate lines SGS and SGD, the string CS is connected between the bit line BL and the cell source CELSRC. Further, by driving unselected word lines WL by the word line driver WLD, unselected memory cells MC are turned on. Accordingly, the sense amplifier SA can apply a voltage to the selected memory cell MC via the bit line BL. In this way, the sense amplifier SA can detect data of the selected memory cell MC or write data in the selected memory cell MC.

Figure 2:
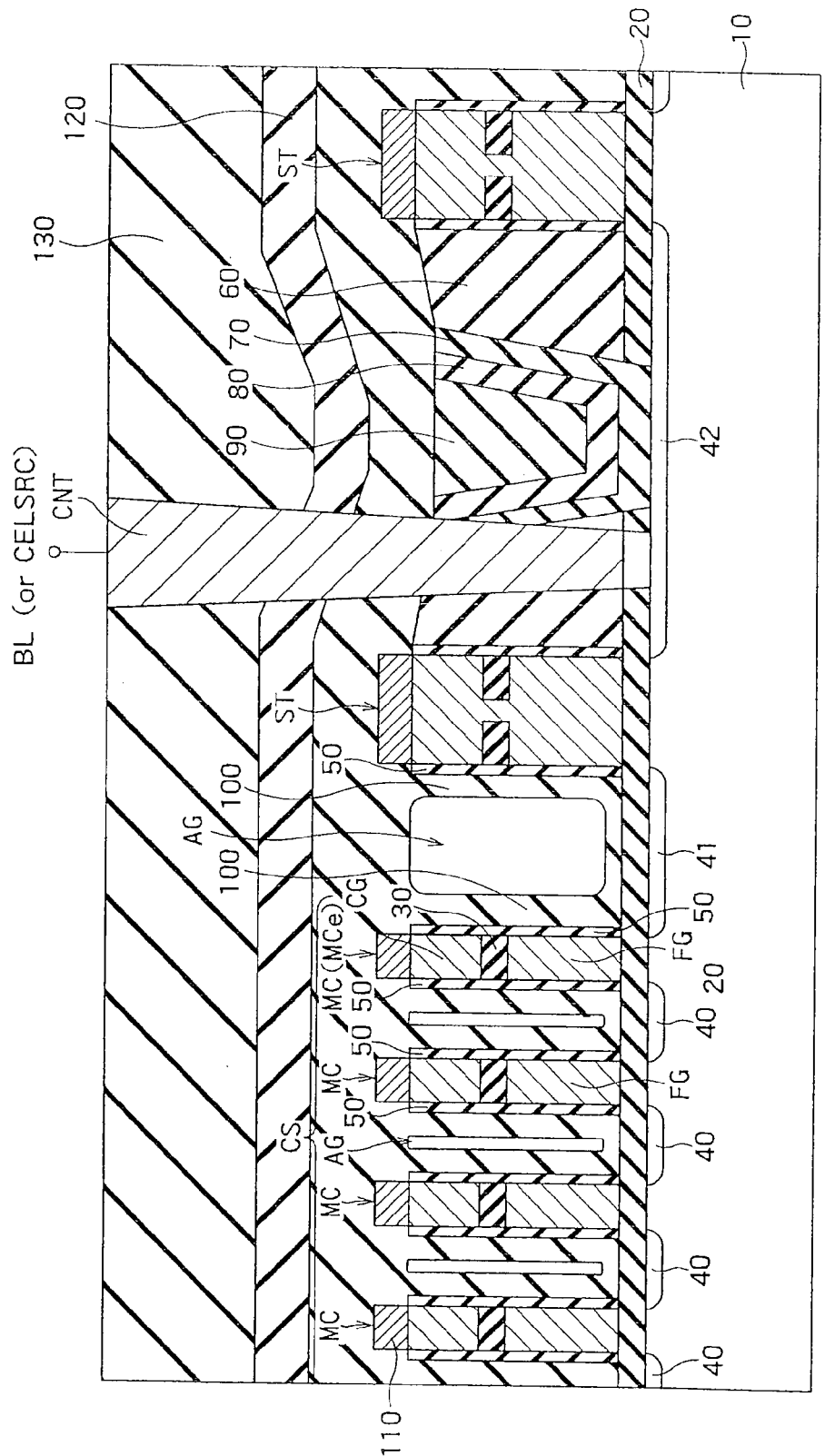
FIG. 2 is a cross-sectional view of a configuration of the semiconductor storage device according to the present embodiment.

FIG. 2 is a cross-sectional view of a configuration of the semiconductor storage device according to the present embodiment. The memory cell MC and the selective transistor ST are formed on a semiconductor substrate 10. The memory cell MC includes a floating gate (charge storage layer) FG on a tunnel dielectric film 20, an inter-poly dielectric film 30 on the floating gate FG, the control gate CG on the inter-poly dielectric film 30, and a diffusion layer (source/drain) 40. The diffusion layer 40 is shared by adjacent memory cells MC, in such a manner that plural memory cells MC are serially connected to each other. The end memory cell MCe is connected to the selective transistor ST by a diffusion layer 41. The selective transistor ST is connected to a contact CNT by a diffusion layer 42. Therefore, the contact CNT is connected to the string CS via the selective transistor ST and can be electrically connected to or disconnected from the string CS depending on the conductive state of the selective transistor ST.

Side surfaces of the floating gate FG and the control gate CG of the memory cell MC are covered by sidewall films 50 and 100. The sidewall films 50 and 100 are formed of an insulating film that hardly traps electric charges (for example, a silicon oxide film). In other words, the sidewall films 50 and 100 cover gate side surfaces opposing to each other between gates of two adjacent memory cells MC. An air gap AG is provided between adjacent sidewall films 100. That is, in a space (a first space) between floating gates and between control gates of adjacent memory cells MC, the sidewall films 50 and 100 cover side surfaces of the floating gates FG and the control gates CG of the adjacent memory cells MC. In the first space, the air gap AG is provided between the sidewall films 100 (in the sidewall film 100).

A side surface of a gate of the selective transistor ST is also covered by the sidewall films 50 and 100. Side surfaces of the floating gate FG and the control gate CG of the end memory cell MCe are also covered by the sidewall films 50 and 100.

The sidewall films 50 and 100 cover the side surfaces of the gates of the end memory cell MCe and the side surface of the gate of the selective transistor ST between the end memory cell MCe and the selective transistor ST. The air gap AG is provided between adjacent sidewall films 100 (in the sidewall film 100) between the gate of the selective transistor ST and the gates FG and CG of the end memory cell MCe. That is, the sidewall films 50 and 100 cover the side surfaces of the gates FG and CG of the end memory cell MCe and the side surface of the gate of the selective transistor ST in a space (a second space) between the end memory cell MCe and the selective transistor. In the second space, the air gap AG is provided between the sidewall film 100 of the end memory cell MCe and the sidewall film 100 of the selective transistor ST.

A silicide 110 is provided on the control gate CG of each of the memory cells MC and on the gate of the selective transistor ST. Accordingly, the gate resistance of the memory cell MC and the selective transistor ST can be reduced.

Insulating films 60, 70, 80, and 90 are filled in a space (a third space) between adjacent selective transistors ST. The insulating films 60, 70, and 90 are silicon oxide films, for example. The insulating film 80 is a silicon nitride film, for example. The insulating film 70 is a liner layer formed of a TEOS film, for example. The insulating film 80 is a liner layer formed of a silicon nitride film, for example. The insulating film 90 is a silicon oxide film with a good covering property using PBSG, NSG, or PSG, for example.

Furthermore, interlayer dielectric films 120 and 130 are further provided so as to cover tops of the memory cell MC, the selective transistor ST, and the insulating films 60, 70, 80, and 90.

The contact CNT penetrates the interlayer dielectric films 120 and 130 and the insulating films 60, 70, 80, and 90 to contact the diffusion layer 42.

According to the present embodiment, the insulating films 60, 70, 80, and 90 are filled between adjacent selective transistors ST, and basically any air gap does not exist therebetween. That is, any air gap does not basically exist between the selective transistor ST and the contact CNT. Accordingly, even when the contact CNT is shifted toward one of the adjacent selective transistors ST as shown in FIG. 2, the air gap AG hardly communicates with a contact hole and the insulating film 60, 70, 80, or 90 is filled between the contact CNT and the selective transistor ST. As a result, the memory according to the present embodiment can maintain a high breakdown voltage between the contact CNT and the selective transistor ST and the reliability high.

Meanwhile, the air gap AG is provided between the end memory cell MCe and the selective transistor with the sidewall films 50 and 100 being interposed therebetween. With this configuration, the coupling capacitance between the end memory cell MCe and the selective transistor ST can be reduced and the breakdown voltage between the selective transistor ST and the end memory cell MCe can be made higher.

The side surfaces of the floating gate FG and the control gate CG of the end memory cell MCe and the gate of the selective transistor ST are protected by the sidewall film 50 and 100. Accordingly, the floating gate FG and the control gate CG of the end memory cell MCe, the gate of the selective transistor ST, an end of the tunnel dielectric film, and an end of the inter-poly dielectric film can be protected from process damage (side etching in a wet etching process) after the air gap AG is formed.

Furthermore, a silicon oxide film that hardly traps electric charges is used for the sidewall films 50 and 100. Therefore, the sidewall films 50 and 100 can suppress influences on the threshold voltage of the end memory cell MCe and other memory cells MC.

For example, a silicon nitride film easily traps electric charges. Accordingly, when the sidewall films 50 and 100 are formed of the silicon nitride film, electric charges are trapped by the sidewall films 50 and 100 with a high possibility during a data writing and deleting operation. In this case, electric charges trapped in the vicinity of the end memory cell MCe may affect data of the end memory cell MCe.

On the other hand, by using a silicon oxide film for the sidewall films 50 and 100, influences on data of the end memory cell MCe and other memory cell MCs can be suppressed.

The air gap AG is also provided between the sidewall films 50 and 100 between adjacent memory cells MC. Therefore, the coupling capacitance between memory cells MC can be reduced and an adjacent interference effect between memory cells MC can be suppressed.

Figure 3:
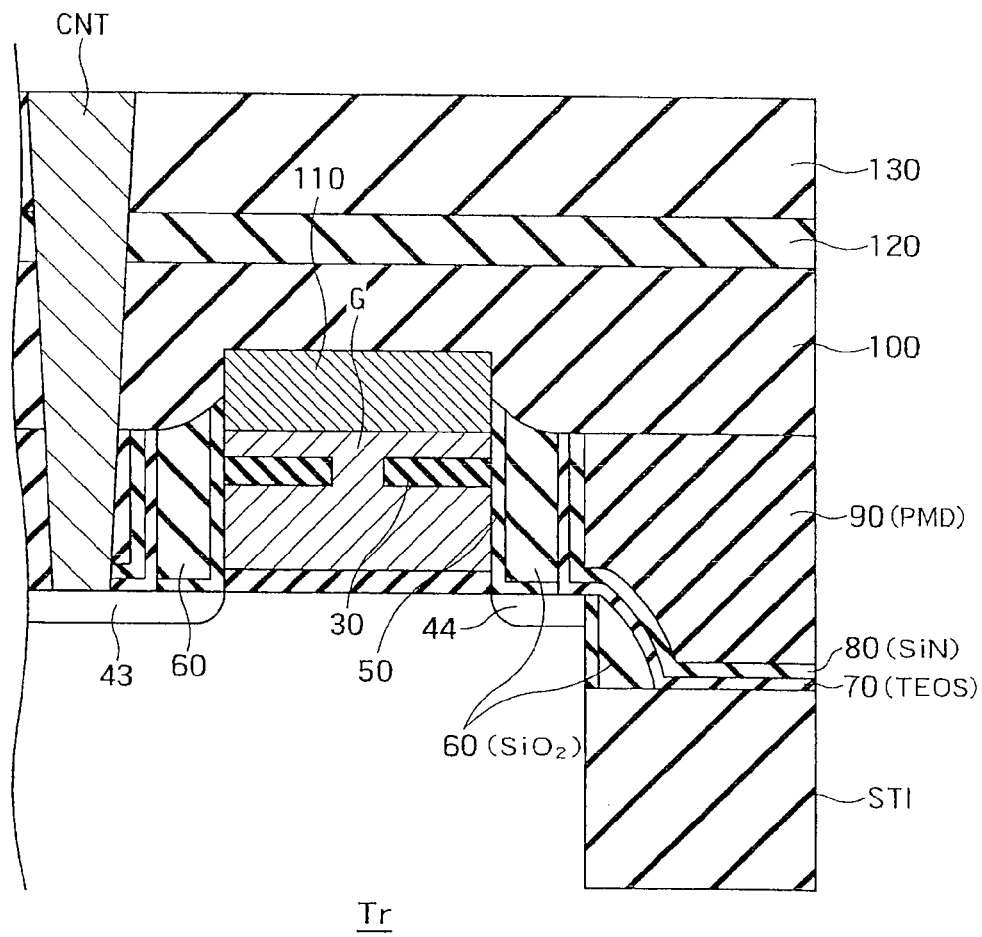
FIG. 3 is a cross-sectional view of a transistor Tr in a peripheral circuit region according to the present embodiment.

FIG. 3 is a cross-sectional view of a transistor Tr in a peripheral circuit region according to the present embodiment. The transistor Tr includes diffusion layers (source/drain) 43 and 44 formed on the semiconductor substrate 10 and a gate electrode G. The silicide 110 is formed on the gate electrode G. The sidewall film 50 and the insulating film (for example, a silicon oxide film) 60 are provided on a side surface of the gate electrode G.

STI (Shallow Trench Isolation) is buried in the semiconductor substrate 10 in an element isolation region. The insulating film 60, the insulating film (for example, a TEOS (Tetraethoxysilane) film) 70, the insulating film (for example, a silicon nitride film) 80, and the silicon oxide film 90 are provided on the element isolation region STI.

A space between the gate G of the transistor Tr and a gate of an adjacent transistor is filled by the sidewall film 50, the insulating films 60 to 100, or the contact CNT, and basically an air gap is not provided.

A manufacturing method of a semiconductor storage device according to the present embodiment is explained next.

Figure 4:
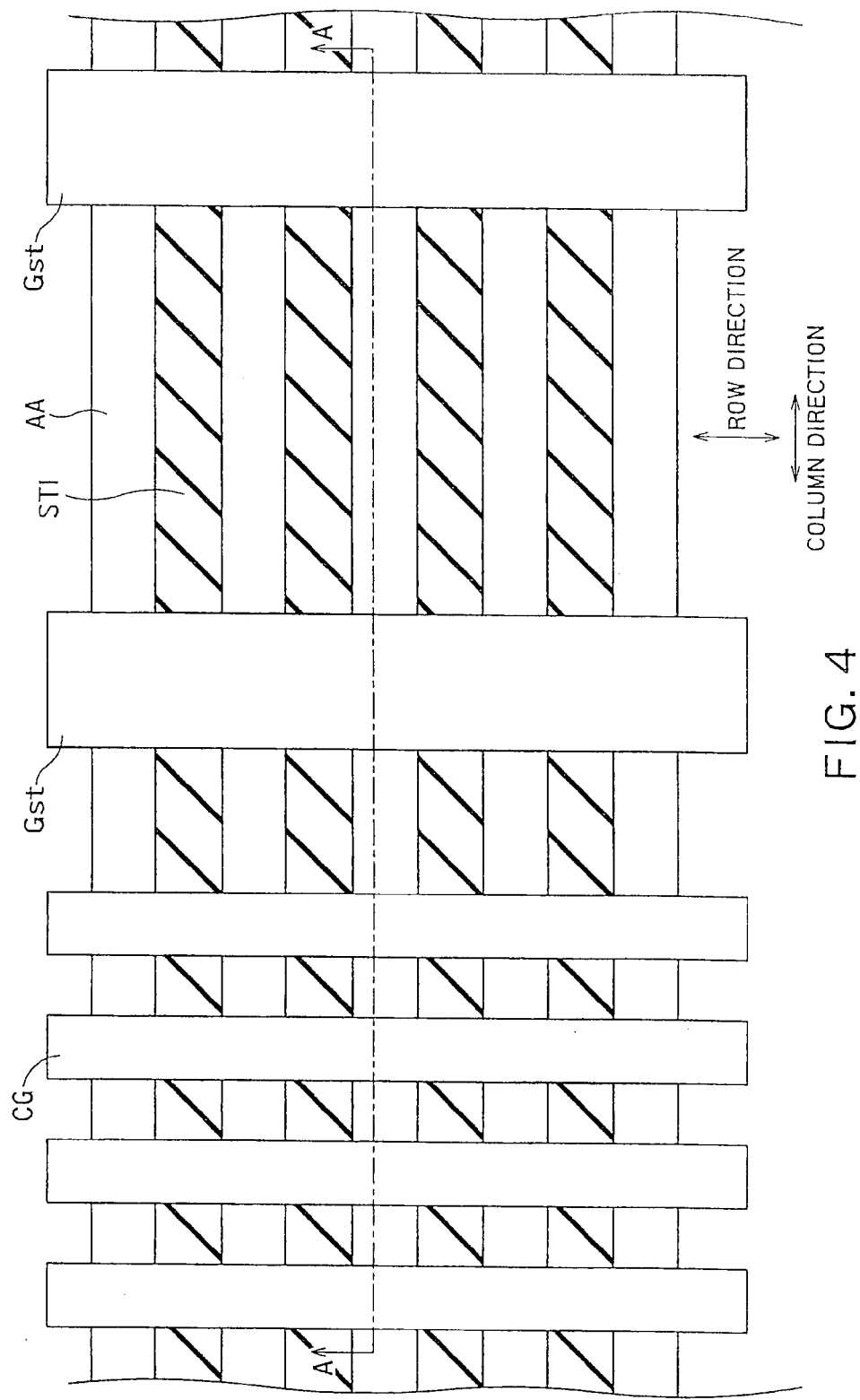
FIG. 4 is a plan view of a configuration immediately after the control gate CG of the memory cell MC and the gate of the selective transistor ST are processed.

FIG. 4 is a plan view of a configuration immediately after the control gate CG of the memory cell MC and the gate of the selective transistor ST are processed. As shown in FIG. 4, an active area AA and the element isolation region STI are arranged in a row direction (an extending direction of the word line WL) and they extend in a column direction (an extending direction of the bit line BL). Accordingly, the active area AA extends in the column direction and is formed in a stripe shape. The bit The BL is formed on the active area AA in a subsequent process.

The control gate CG and a gate Gst of the selective transistor ST extend in the row direction. The control gate CG can function as the word line WL. Although not shown in FIG. 4, the floating gate FG is provided below the control gate CG so as to correspond to each of the memory cells MC. Accordingly, the floating gate FG is insulated for each of the active areas AA adjacent to each other in the row direction, unlike the control gate CG.

Figure 5:
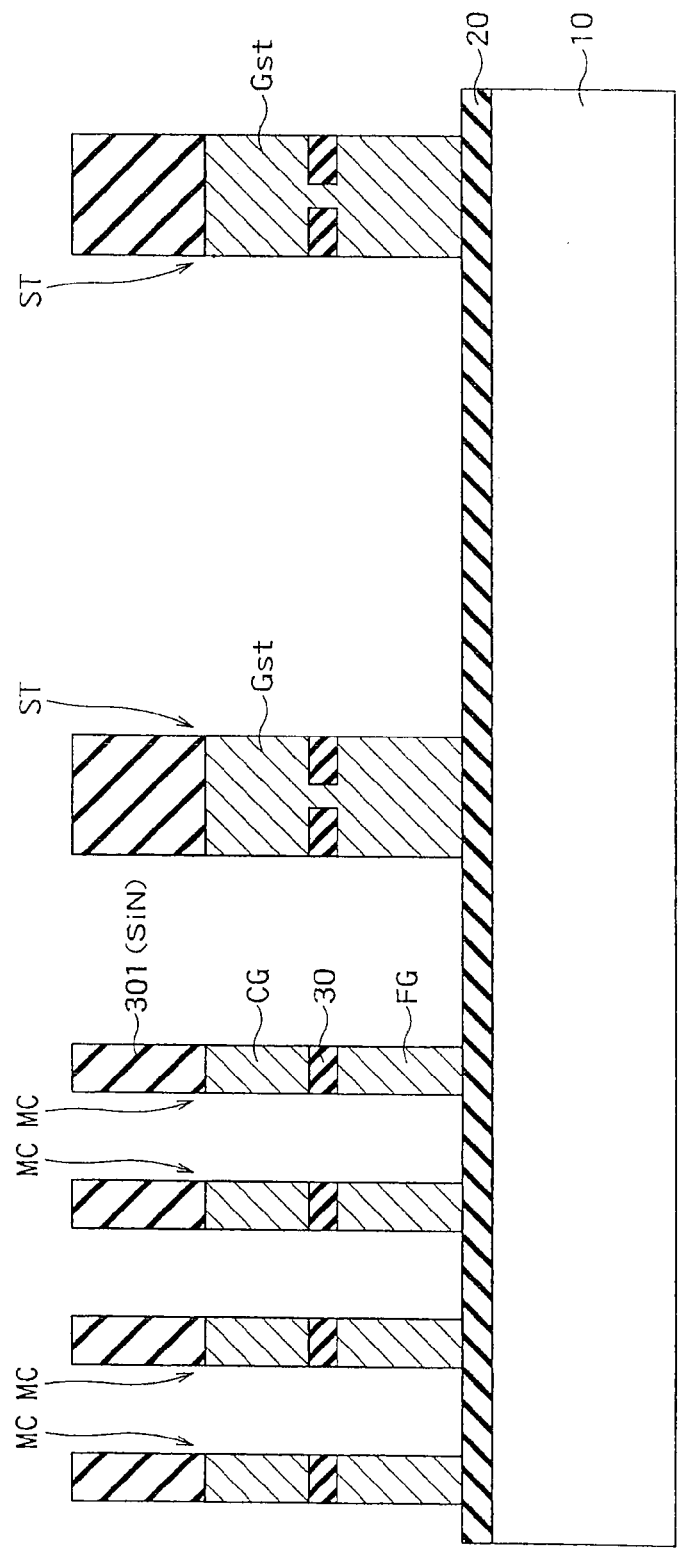
FIG. 5 is a cross-sectional view along a line A-A shown in FIG. 4.

FIG. 5 is a cross-sectional view along a line A-A shown in FIG. 4. FIGS. 6 to 14 to which "A" is attached are cross-sectional views of the manufacturing method of a memory according to the present embodiment, subsequent to the process shown in FIG. 5. FIGS. 6 to 14 to which "B" is attached are cross-sectional views of a manufacturing method of the transistor Tr in a peripheral circuit region. FIGS. 6A and 6B to FIGS. 14A and 14B respectively show cross-sections in the same manufacturing steps.

With reference to FIG. 5, the tunnel dielectric film 20 is formed on the semiconductor substrate 10. The tunnel dielectric film 20 is formed by CVD (Chemical Vapor Deposition) or thermal oxidization. A material for the floating gate FG (for example, polysilicon) is deposited on the tunnel dielectric film 20. The inter-poly dielectric film 30 is formed on the floating gate FG. For the inter-poly dielectric film 30, a silicon oxide film, a silicon nitride film, aluminum oxide formed by CVD, or a laminated film including these films is used. At least a part of the inter-poly dielectric films 30 of the selective transistor ST and the transistor in the peripheral circuit region is removed by lithography and RIE (Reactive Ion Etching). With this process, in the selective transistor ST and the transistor in the peripheral circuit region, the material for the floating gate FG is connected to a material for the control gate CG and these materials function as the single gate Gst or G.

Next, the material for the control gate CG (for example, polysilicon) is deposited on the inter-poly dielectric film 30 by CVD. A mask material 301 (for example, a silicon nitride film) is further deposited on the material for the control gate CG and the mask material 301 is processed in a pattern of a gate electrode by lithography and RIE.

The material for the control gate CG, the inter-poly dielectric film 30, and the material for the floating gate FG are then etched by RIE by using the mask material 301 as a mask. With this process, a gate configuration shown in FIG. 5 can be obtained.

Figure 6A:
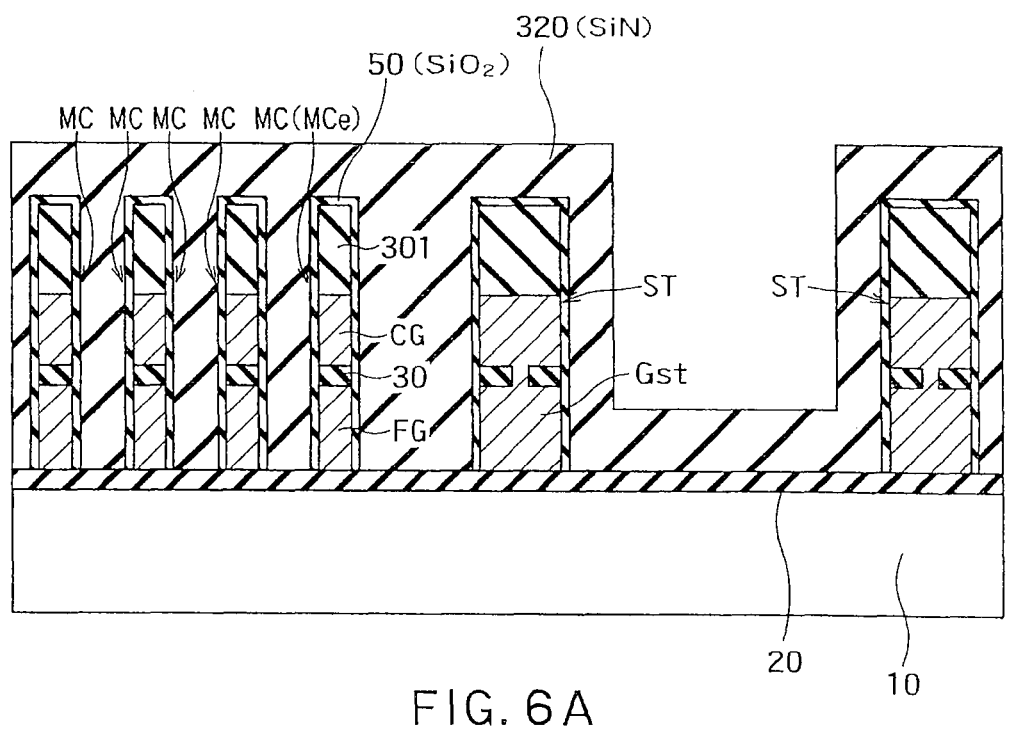
FIGS. 6 to 14 to which "A" is attached are cross-sectional views of the manufacturing method of a memory according to the present embodiment, subsequent to the process shown in FIG. 5.
Figure 6B:
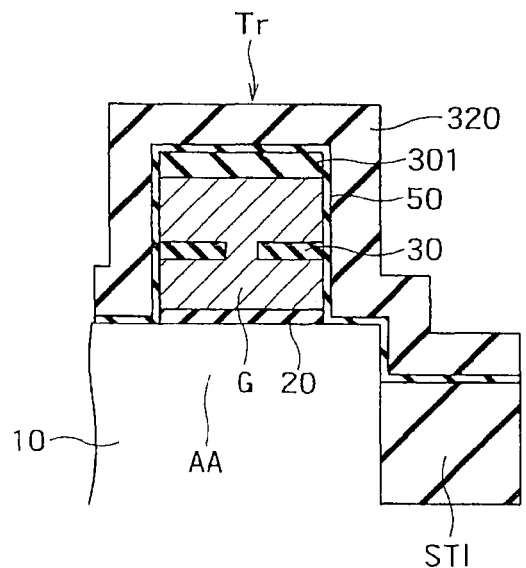

The transistor Tr in the peripheral circuit region is formed like the selective transistor ST as shown in FIG. 6B. The shallow trench isolation region STI has been already formed at this point by a known method. A surface of the shallow trench isolation region STI is depressed to be lower than a surface of the active area AA of the semiconductor substrate 10.

Next, as shown in FIG. 6A, the sidewall film (for example, a silicon oxide film) 50 is deposited by CVD and a silicon nitride film 320 is deposited on the sidewall film 50. At this time, the sidewall film 50 protects the floating gate FG, the control gate CG, and the gate electrode Gst. The silicon nitride film 320 is deposited to a thickness that fills the space (the first space) between adjacent memory cells MC (the first space) and the space (the second space) between the end memory cell MCe and the selective transistor ST, but does not fill the space (the third space) between adjacent selective transistors ST. With this process, as shown in FIG. 6A, the silicon nitride film 320 is filled between adjacent control gates CG, between adjacent floating gates FG, and between the gate FG, CG and the gate Gst adjacent to each other. Meanwhile, the silicon nitride film 320 covers the side surface of the gate Gst, but is not filled between adjacent gates Gst.

In the peripheral circuit region, as shown in FIG. 6B, the sidewall film 50 and the silicon nitride film 320 are deposited on the transistor Tr and the shallow trench isolation region STI.

Next, the silicon nitride film 320 is wet-etched by using a hot phosphoric-acid solution, in such a manner that the silicon nitride film 320 between gates Gst of adjacent selective transistors ST is removed by a thickness that the silicon nitride film 320 is deposited. At this time, the silicon nitride film 320 remains between the memory cells MC and between the end memory cell MCe and the selective transistor ST. This is because wet etching is isotropic etching and the silicon nitride film 320 in a narrow space remains. Accordingly, the silicon nitride film 320 between the adjacent selective transistors ST can be removed while the silicon nitride film 320 is filled between the memory cells MC and between the end memory cell MCe and the selective transistor ST. Accordingly, the configuration shown in FIG. 7A can be obtained.

Figure 7A:
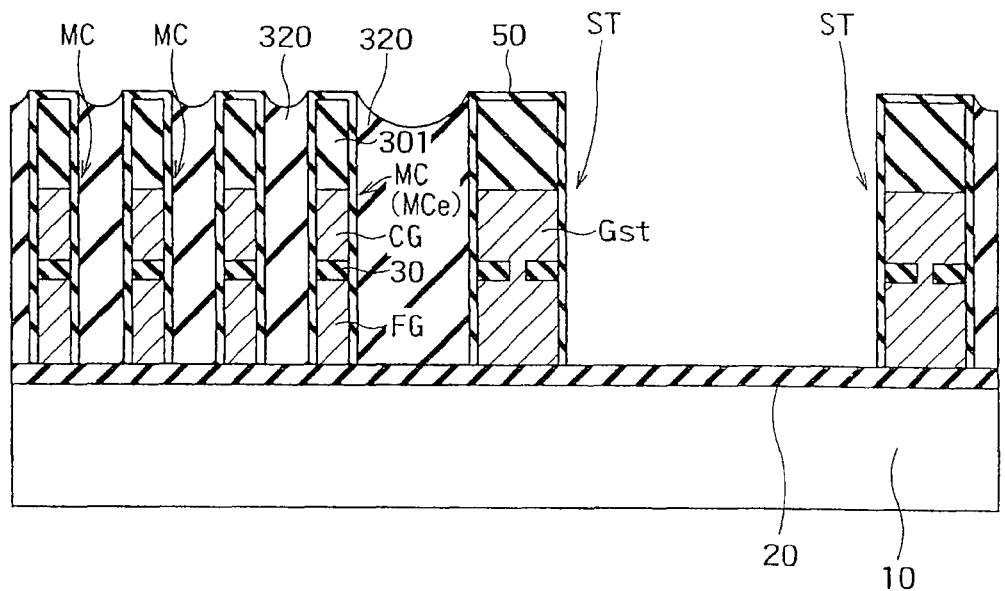
Figure 7B:
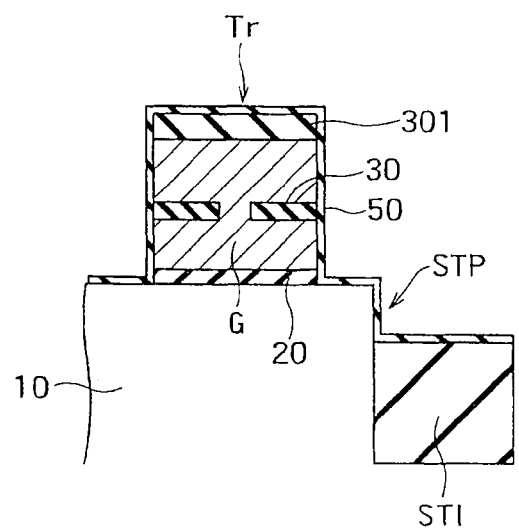

In the peripheral circuit region, as shown in FIG. 7B, the silicon nitride film 320 on the shallow trench isolation region STI is also removed. This is because the shallow trench isolation region STI is wider than the space between adjacent memory cells MC or between the end memory cell MCe and the selective transistor ST, and the silicon nitride film 320 is not filled therein. Accordingly, the silicon nitride film hardly remains on a step STP at a boundary between the transistor Tr and the shallow trench isolation region STI.

Figure 8A:
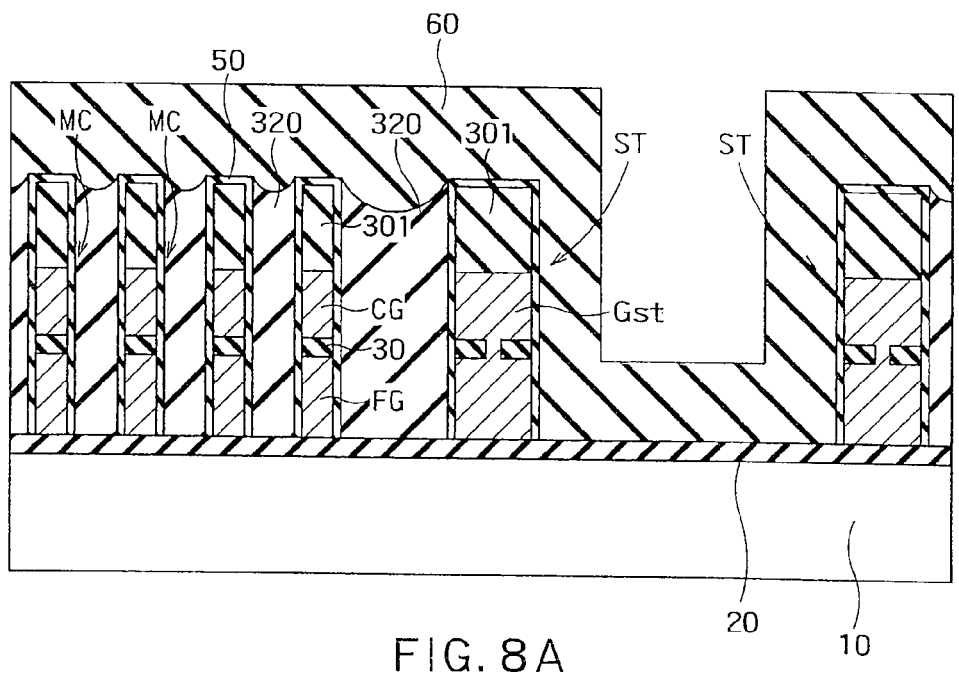

Next, the insulating film 60 is deposited on the silicon nitride film 320 and the sidewall film 50 by CVD. At this time, as shown in FIG. 8A, the insulating film 60 is not filled between the gates Gst of the adjacent selective transistors ST.

Figure 8B:
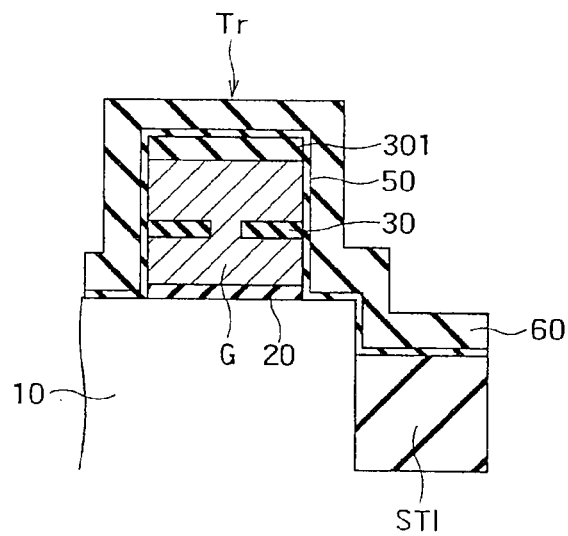

In the peripheral circuit region, as shown in FIG. 8B, the insulating film 60 is deposited on the transistor Tr and the shallow trench isolation region STI.

Figure 9A:
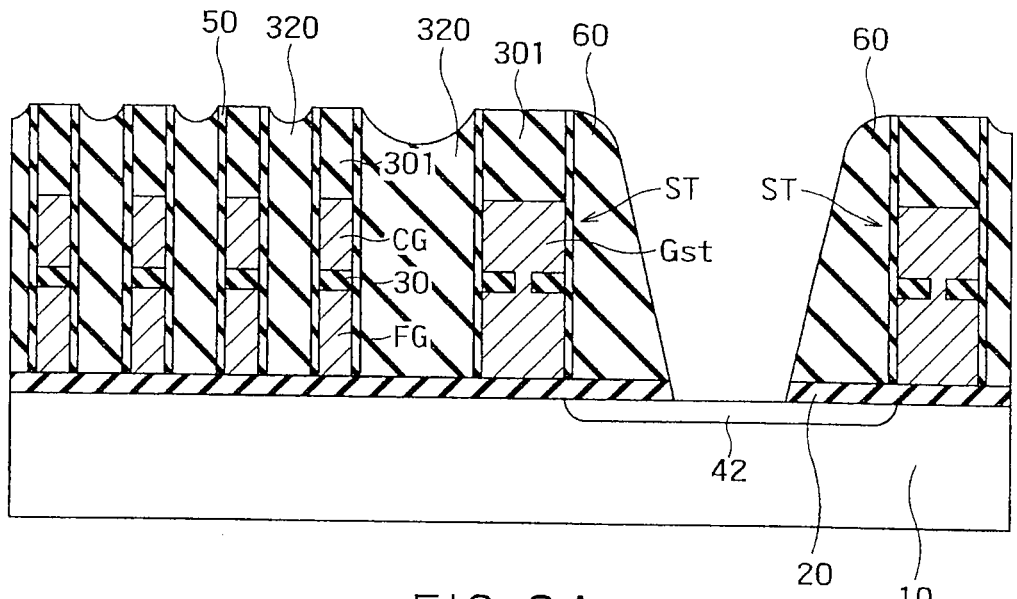

Next, the insulating film 60 is anisotropically etched by RIE. By this etching, as shown in FIG. 9A, the insulating film 60 is made to remain as a spacer on opposing side surfaces in the space (the third space) between the gates Gst of the adjacent selective transistors ST. An impurity is implanted in the semiconductor substrate 10 between the selective transistors ST by using the insulating film 60 and the silicon nitride films 320 and 301 as a mask. By diffusing the impurity, the diffusion layer 42 can be formed.

Figure 9B:
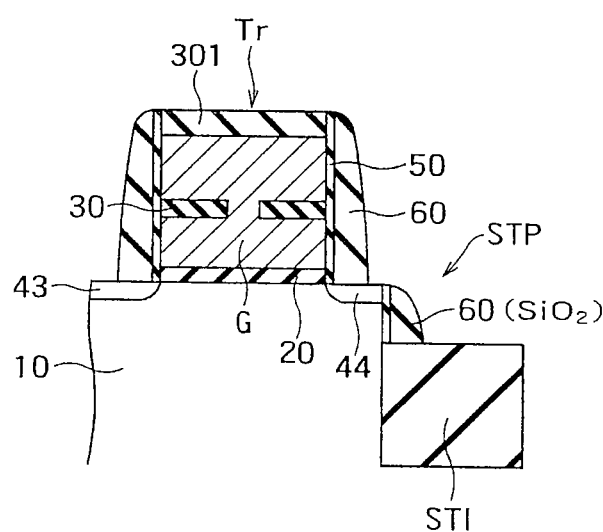

At this time, in the peripheral circuit region, the insulating film 60 is made to remain as a spacer on the side surface of the gate G of the transistor Tr and the side surface of the step STP, as shown in FIG. 9B. The diffusion layers 43 and 44 are formed by processes such as exposure, diffusion, development, and impurity implantation.

Figure 10A:
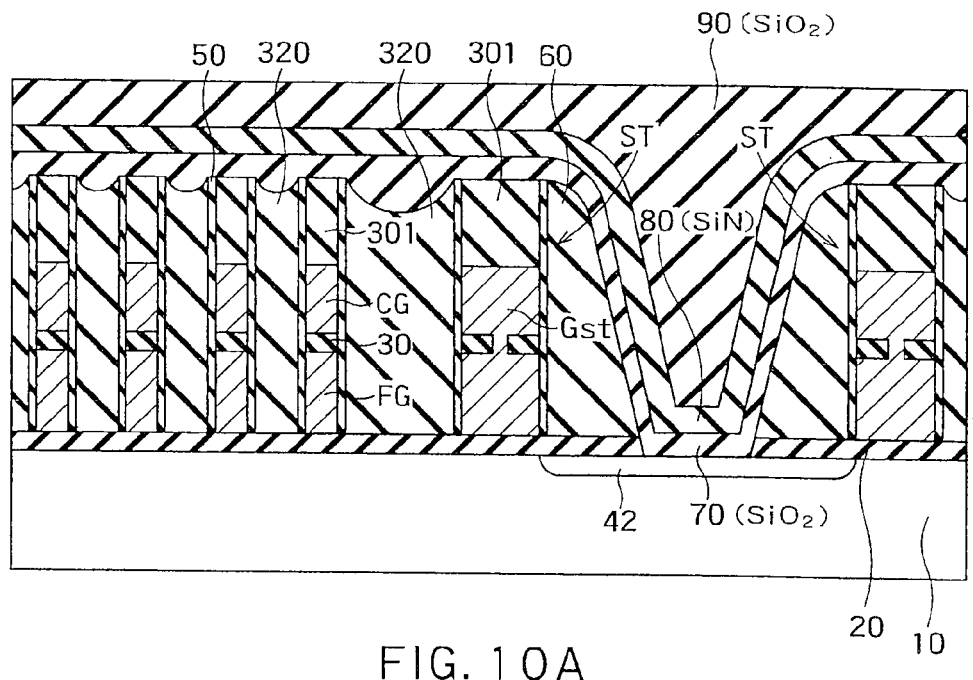

Next, the insulating film 70, the insulating film 80, and the insulating film 90 are subsequently deposited on the sidewall film 50, the insulating film 60, and the silicon nitride films 301 and 320, as shown in FIG. 10A. The insulating films 70 and 80 function as a stopper at the time of forming a contact. The insulating film 90 is made of an insulating material with an good burying property so as to be buried between the gates Gst of the adjacent selective transistors ST, and can be a silicon oxide film such as BPSG (Boron Phosphorus Silicate Glass), NSG (Non-doped Silicate Glass), or PSG (Phosphorus Silicate Glass).

Figure 10B:
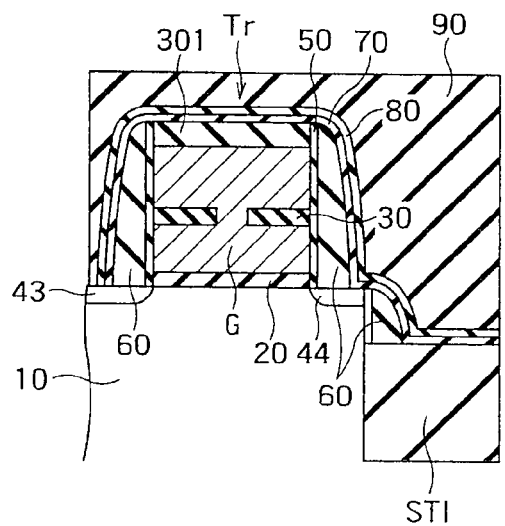

In the peripheral circuit region, as shown in FIG. 10B, the insulating film 70, the insulating film 80, and the insulating film 90 are deposited on the transistor Tr and the shallow trench isolation region STI.

Next, the insulating film 90, the insulating film 80, and the insulating film 70 are planarized by CMP (Chemical Mechanical Polishing) until the silicon nitride film 301 is exposed. Accordingly, the configuration shown in FIG. 11A can be obtained.

Figure 11A:
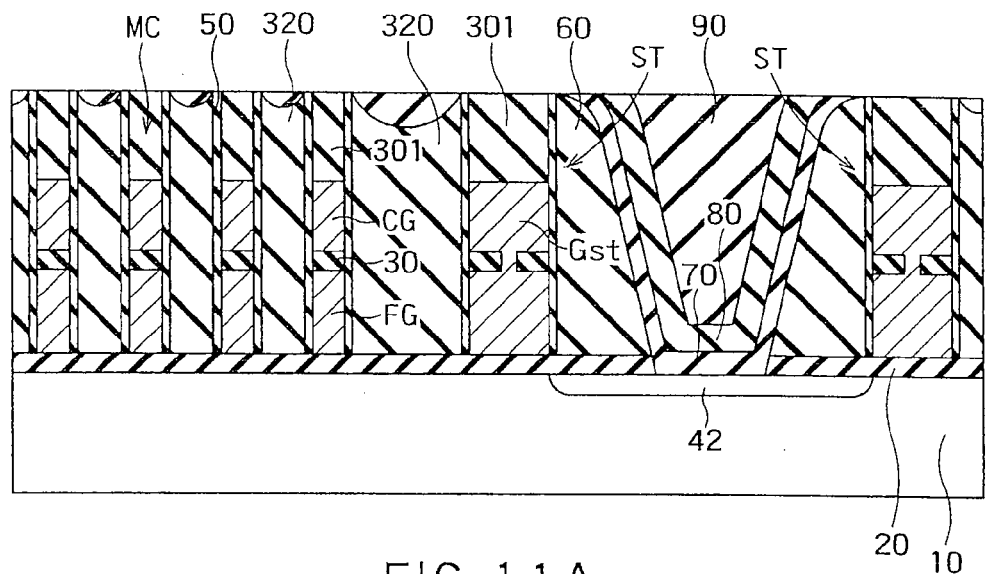
Figure 11B:
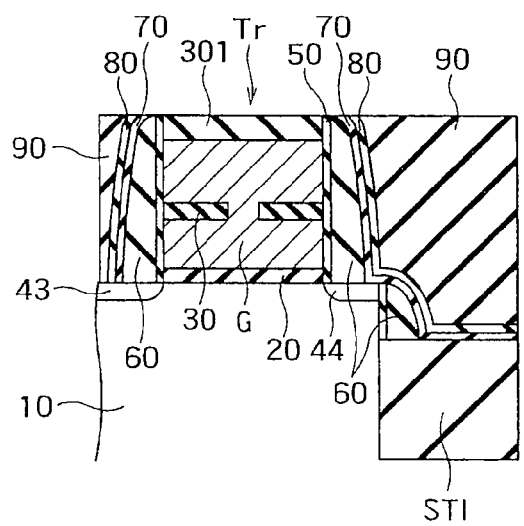

In the peripheral circuit region, the silicon nitride film 301 on the gate G of the transistor Tr is exposed as shown in FIG. 11B.

Figure 12A:
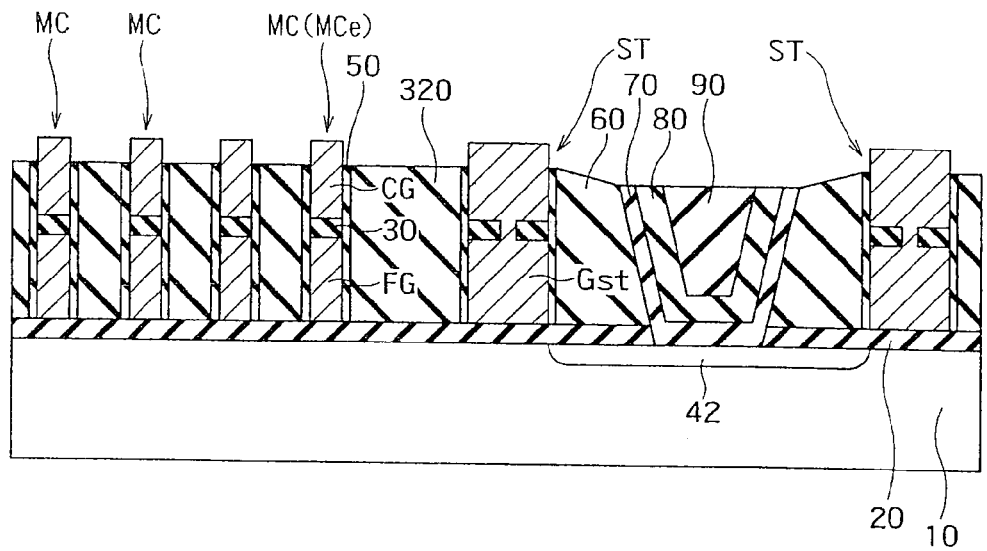

Next, as shown in FIG. 12A, tops of the control gate CG of the memory cell MC and the gate Gst of the selective transistor ST are exposed by using CMP and RIE and the like.

Figure 12B:
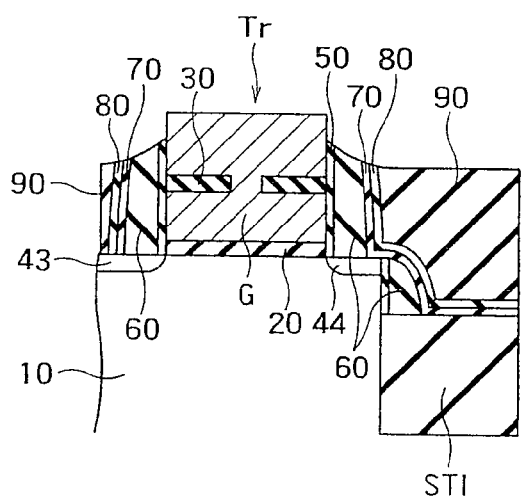

In the peripheral circuit region, the top of the gate G of the transistor Tr is exposed as shown in FIG. 12B.

Next, the insulating films 60, 70, 80, and 90 between the selective transistors ST are covered by a photoresist 370 using lithography. Meanwhile, the silicon nitride film 320 between the memory cells MC and between the end memory cell MCe and the selective transistor ST is exposed. Next, the silicon nitride film 320 in the first space between the memory cells MC and in the second space between the end memory cell MCe and the selective transistor ST is selectively removed by using a hot phosphoric-acid solution. Accordingly, the configuration shown in FIG. 13A can be obtained. Because the insulating films 60, 70, 80, and 90 are protected by the photoresist 370, the insulating films 60, 70, 80, and 90 maintain to be filled in the third space between the adjacent selective transistors ST.

Figure 13A:
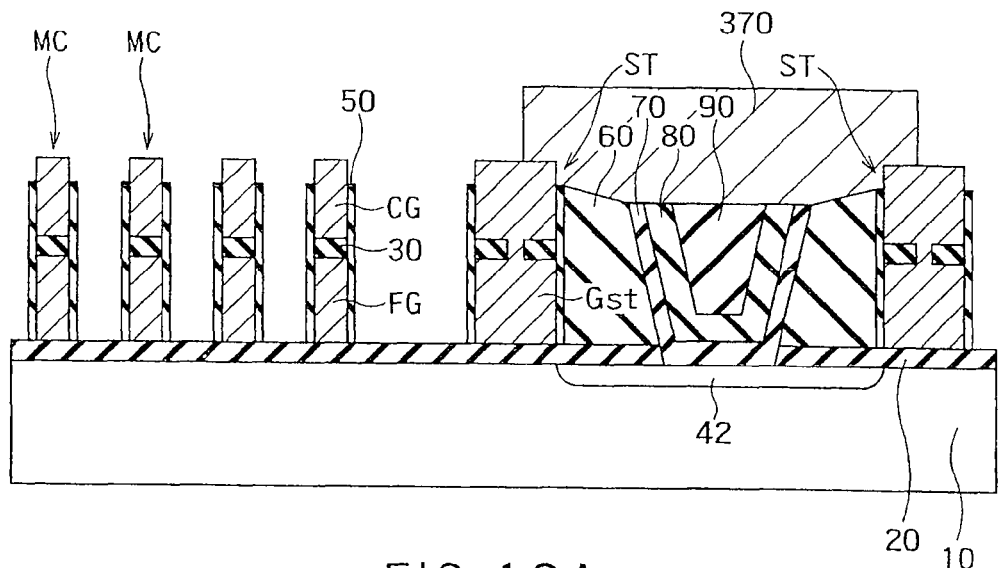
Figure 13B:
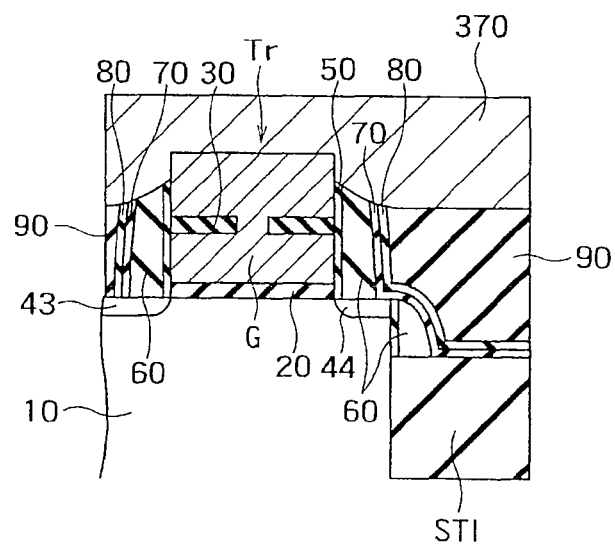

In the peripheral circuit region, the photoresist 370 covers tops of the transistor Tr and the shallow trench isolation region STI as shown in FIG. 13B. While the insulating film 60 remains on the step STP between the transistor Tr and the shallow trench isolation region STI, the silicon nitride film does not remain. Accordingly, deterioration in electric property caused by trapping of electric charges in the silicon nitride film is suppressed.

The tops of the control gate CG and the gate Gst are silicided by Mo, W, Ti, Co, Ni or the like.

Figure 14A:
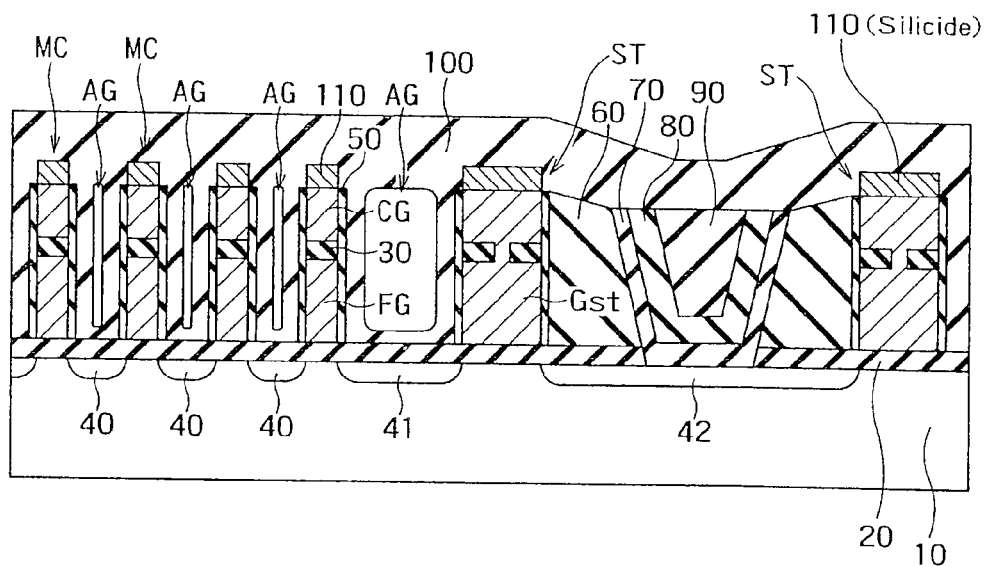
Figure 14B:
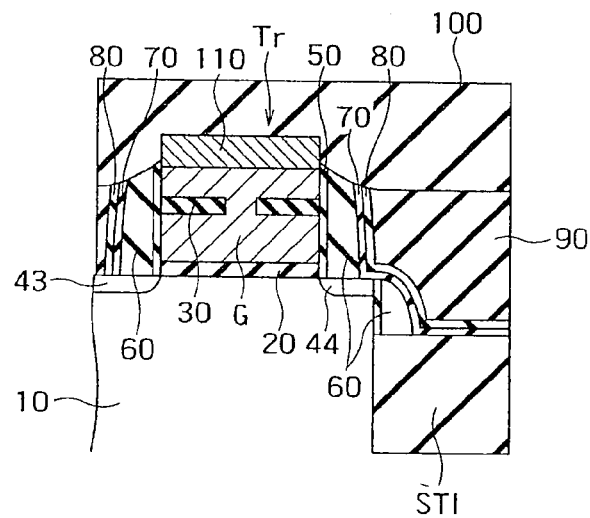

Next, the sidewall film 100 is deposited on the memory cell MC and the selective transistor ST by CVD under deposition conditions with an inferior covering property. The sidewall film 100 is thus deposited on side surfaces of the memory cell MC and the selective transistor ST. Openings of the first space between the adjacent memory cells MC and the second space between the end memory cell MCe and the selective transistor ST are blocked before these spaces are filled by the sidewall film 100. With this process, as shown in FIG. 14A, the air gap AG is formed in the sidewall film 100 between the adjacent memory cells MC and in the sidewall film 100 between the end memory cell MCe and the selective transistor ST.

In the peripheral circuit region, the sidewall film 100 is deposited on the transistor Tr and the shallow trench isolation region STI.

After the sidewall film 100 is planarized, the interlayer dielectric films 120 and 130 are deposited. A contact hole is formed by lithography and RIE and a conductive material is filled in the contact hole. Accordingly, the contact CNT is formed and the memory shown in FIG. 2 is completed.

According to the present embodiment, while the air gap AG is formed in the first space between the adjacent memory cells MC and the second space between the end memory cell MCe and the selective transistor ST, the air gap AG is not basically formed in the third space between the contact CNT and the selective transistor ST and in the peripheral circuit region. Accordingly, a short-circuit between the contact CNT and the selective transistor ST or the transistor Tr in the peripheral circuit region can be prevented, while the adjacent interference effect is suppressed. As a result, the entire memory can be downscaled while its reliability is maintained high.

Furthermore, according to the present embodiment, while the air gap AG is formed between the adjacent memory cells MC and between the end memory cell MCe and the selective transistor ST, the side surfaces of the floating gate FG, the control gate CG, and the gate Gst of the selective transistor ST are covered by the sidewall films (the silicon oxide films) 50 and 100. Therefore, the sidewall films 50 and 100 can protect the floating gate FG, the control gate CG, and the gate Gst of the selective transistor ST from process damage after the air gap AG is formed.

Further, with reference to FIG. 7A, the silicon nitride film 320 is filled between the end memory cell MCe and the selective transistor ST, as well as between the memory cells MC. Accordingly, it suffices that the photoresist 370 shown in FIG. 13A covers the space between the selective transistors ST.

When a laminated film of a silicon oxide film and a silicon nitride film is filled between the end memory cell MCe and the selective transistor ST, at the time of removing the silicon nitride film between the memory cells MC, dust of the silicon oxide film is mixed with a hot phosphoric-acid solution.

According to the present embodiment, because the silicon nitride film 320 is filled between the end memory cell MCe and the selective transistor ST, even when the space between the end memory cell MCe and the selective transistor ST is etched, such a problem about dust hardly occurs. Therefore, according to the present embodiment, the air gap AG can be formed also between the end memory cell MCe and the selective transistor ST.

While an example of forming the diffusion layers 40 to 44 by impurity implantation has been explained in the present embodiment, as long as the memory cell MC and the selective transistor ST can be serially connected to each other for constituting memory strings, it is possible to dispense with the diffusion layers 40 to 44.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a semiconductor layer;
    a gate insulating film disposed above the semiconductor layer,
    a gate electrode disposed above the gate insulating film;
    diffusion layers formed in the semiconductor layer at side portions of the gate electrode; and
    an isolation insulating film disposed in the semiconductor layer at an opposite side of one of the diffusion layers;
    wherein an upper surface of the isolation insulating film is lower than that of an upper surface of the semiconductor layer, and a step is provided between the upper surface of the isolation insulating film and the upper surface of the semiconductor layer,
    the device further comprises:
    a first insulating film provided on a side surface of the step;
    a second insulating film provided on at least a part of a side surface of the gate electrode;
    a third insulating film provided on a side surface of the step via the first insulating film and on at least a first part of an upper surface of the isolation insulating film;
    a fourth insulating film provided on a side surface of the gate electrode via the second insulating film; and
    a fifth insulating film provided on the third and the fourth insulating films and on a second part of the upper surface of the isolation insulating film.

2. The device of claim 1, further comprising:
    a memory cell string in which a plurality of memory cells each having a gate are serially connected to each other;
    a selective transistor connected to an end memory cell at an end of the memory cell string;
    a sidewall film covering a side surface of a gate of the end memory cell and a side surface of a gate of the selective transistor between the end memory cell and the selective transistor;
    a contact connected to the memory cell string via the selective transistor; and
    an insulating film filled between a gate of the selective transistor and the contact, wherein
    an air gap is provided between the sidewall film of the end memory cell and the sidewall film of the selective transistor.

3. The device of claim 2, wherein
    the sidewall film covers side surfaces of gates of two adjacent memory cells between the gates of the two adjacent memory cells in the memory cell string, and
    the air gap is provided between the sidewall films of the two adjacent memory cells.

4. The device of claim 2, further comprising a peripheral circuit region controlling a memory cell array comprising the memory cell strings, wherein
    a space between a gate of a transistor in the peripheral circuit region and a gate of a transistor adjacent to the transistor in the peripheral circuit region is filled by an insulating film or a contact.

5. The device of claim 3, further comprising a peripheral circuit region controlling a memory cell array comprising the memory cell strings, wherein
    a space between a gate of a transistor in the peripheral circuit region and a gate of a transistor adjacent to the transistor in the peripheral circuit region is filled by an insulating film or a contact.

6. The device of claim 1, wherein the device is a NAND-type flash memory.

7. The device of claim 1, wherein a material of the third insulating film is the same as a material of the fourth insulating film.

8. The device of claim 1, wherein a material of the first insulating film is same as a material of the second insulating film.

9. The device of claim 1, wherein a material of the first insulating film is a silicon oxide film.

10. The device of claim 1, wherein a material of the third insulating film is a silicon oxide film.

11. The device of claim 1, further comprising:
    a sixth insulating film provided on the fifth insulating film and buried in the step.

12. The device of claim 1, wherein
    the fifth insulating film is a laminated film including at least a silicon nitride film.

13. The device of claim 1, wherein
    a material of the first insulating film is the same as a material of the second insulating film,
    a material of the third insulating film is the same as a material of the fourth insulating film, and
    the first to fourth insulating films do not include a silicon nitride film.

* * * * *